(12) United States Patent
Luedtke et al.

(10) Patent No.: US 10,317,245 B2
(45) Date of Patent: Jun. 11, 2019

(54) RESOLVER EXCITATION FREQUENCY SCHEDULING FOR NOISE IMMUNITY

(71) Applicant: FORD GLOBAL TECHNOLOGIES, LLC, Dearborn, MI (US)

(72) Inventors: Daniel R. Luedtke, Beverly Hills, MI (US); Michael W. Degner, Novi, MI (US)

(73) Assignee: FORD GLOBAL TECHNOLOGIES, LLC, Dearborn, MI (US)

( * ) Notice: Subject to any disclaimer, the term of this patent is extended or adjusted under 35 U.S.C. 154(b) by 1184 days.

(21) Appl. No.: 14/164,477

(22) Filed: Jan. 27, 2014

(65) Prior Publication Data

US 2015/0211887 A1   Jul. 30, 2015

(51) Int. Cl.
*G01D 5/12* (2006.01)
*G01R 19/00* (2006.01)
*H02K 11/00* (2016.01)
*H02P 13/00* (2006.01)
*H02P 6/16* (2016.01)
(Continued)

(52) U.S. Cl.
CPC ............... *G01D 5/12* (2013.01); *B60L 7/14* (2013.01); *B60L 15/2009* (2013.01); *B60L 50/16* (2019.02); *B60L 50/61* (2019.02); *G01R 19/0053* (2013.01); *H02P 6/16* (2013.01); *H02P 13/00* (2013.01); *H02P 29/50* (2016.02); *B60L 2210/10* (2013.01); *B60L 2210/40* (2013.01); *B60L 2240/12* (2013.01); *B60L 2240/421* (2013.01); *Y02T 10/6217* (2013.01); *Y02T 10/644* (2013.01); *Y02T 10/645* (2013.01); *Y02T 10/7077* (2013.01); *Y02T 10/7216* (2013.01);
(Continued)

(58) Field of Classification Search
CPC ............ H02P 23/00; H02P 7/00; H02K 24/00
USPC .......................................... 318/494, 603, 801
See application file for complete search history.

(56) References Cited

U.S. PATENT DOCUMENTS 3,878,535 A   4/1975  Twiss
4,472,669 A   9/1984  Denham et al.
(Continued)

FOREIGN PATENT DOCUMENTS

EP   0479525 A2   9/1991
JP   2005147729   6/2005

OTHER PUBLICATIONS

12-Bit R/D Converter with Reference Oscillator, AD2S1200, Analog Devices, Rev. 0/ pp. 1-24, 2003.

*Primary Examiner* — Jay Patidar
*Assistant Examiner* — Zannatul Ferdous
(74) *Attorney, Agent, or Firm* — David B. Kelley; MacMillan, Sobanski & Todd, LLC

(57) ABSTRACT

An electric machine (e.g., motor or generator) for an electric drive system of an electric vehicle is adapted to be coupled to wheels of the vehicle for conversion between stored electrical energy and rotation of the wheels. A resolver is coupled to the electric machine having a rotor rotating with the electric machine, the resolver responding to an excitation signal to produce a position signal. A controller is coupled to the resolver to receive the position signal and coupled to the electric machine to control the conversion. The controller generates the excitation signal at a variable frequency selected as a function of an operating point of the electric machine to avoid harmonic noise peaks propagating at the electric machine. Consequently, the position signal is relatively less affected by electromagnetic noise.

19 Claims, 3 Drawing Sheets

(51) Int. Cl.
*B60L 7/14* (2006.01)
*B60L 15/20* (2006.01)
*H02P 29/50* (2016.01)
*B60L 50/61* (2019.01)
*B60L 50/16* (2019.01)

(52) U.S. Cl.
CPC ........ *Y02T 10/7241* (2013.01); *Y02T 10/7275* (2013.01)

(56) References Cited

U.S. PATENT DOCUMENTS

| | | | |
|---|---|---|---|
| 4,682,090 A * | 7/1987 | Schmidt | G01D 5/243 318/636 |
| 4,912,387 A | 3/1990 | Moulds, III | |
| 5,461,293 A * | 10/1995 | Rozman et al. | 318/603 |
| 8,188,896 B2 | 5/2012 | Sata et al. | |
| 8,272,265 B2 | 9/2012 | Bucher et al. | |
| 8,456,115 B2 * | 6/2013 | Wu et al. | 318/400.13 |
| 2002/0149335 A1 * | 10/2002 | Imai et al. | 318/494 |
| 2006/0176051 A1 | 8/2006 | Miya | |
| 2007/0236336 A1 * | 10/2007 | Borcherding | 340/10.34 |
| 2008/0309527 A1 | 12/2008 | Inoue | |
| 2010/0066347 A1 | 3/2010 | Nakamura et al. | |
| 2012/0286716 A1 * | 11/2012 | Ohsugi | 318/494 |
| 2014/0014064 A1 * | 1/2014 | Kawasumi | 123/311 |
| 2015/0207444 A1 * | 7/2015 | Son | H02P 6/16 318/400.14 |
| 2016/0308477 A1 * | 10/2016 | Lim | H02P 27/06 |

* cited by examiner

RESOLVER EXCITATION FREQUENCY SCHEDULING FOR NOISE IMMUNITY

CROSS REFERENCE TO RELATED APPLICATIONS

Not Applicable.

STATEMENT REGARDING FEDERALLY SPONSORED RESEARCH

Not Applicable.

BACKGROUND OF THE INVENTION

The present invention relates in general to position sensing for electric machines used in electric vehicle drives, and, more specifically, to an excitation signal used to drive a resolver in an electric drive system.

Electric vehicles, such as hybrid electric vehicles (HEVs) and plug-in hybrid electric vehicles (PHEVs), use inverter-driven electric machines to provide traction torque and regenerative braking torque. A typical electric drive system includes a DC power source (such as a battery pack or a fuel cell) coupled by contactor switches to a variable voltage converter (VVC) to regulate a main bus voltage across a main linking capacitor. A first inverter is connected between the main bus and a traction motor to propel the vehicle. A second inverter is connected between the main bus and a generator to regenerate energy during braking to recharge the battery through the VVC. As used herein, electric machine refers to either the motor or generator.

The inverters include transistor switches (such as insulated gate bipolar transistors, or IGBTs) connected in a bridge configuration. An electronic controller turns the switches on and off in order to invert a DC voltage from the bus to an AC voltage applied to the motor, or to invert an AC voltage from the generator to a DC voltage on the bus. In each case, the inverters are controlled in response to various sensed conditions including the rotational position of the electric machine.

Position signals are typically sensed using a device known as a resolver. One preferred type of resolver for use in an electric vehicle is the variable reluctance resolver. A resolver produces a signal that provides an absolute indication of the rotational position of the rotor of the electric machine to which it is attached. The resolver has a rotor and stator, wherein the resolver's rotor is connected to the rotor of the electric machine in order to rotate together. The resolver has a primary winding that receives an excitation signal comprised of an AC voltage. A pair of secondary windings of the resolver each generates an induced voltage that depends on the position of the rotor. A ratio of the induced voltages provides a measure of the rotational position of the electric machine.

A specific frequency used for the excitation signal can be chosen within a fairly wide range of frequencies. Integrated circuit products known as a resolver-to-digital (R2D) chip are available that generate an excitation signal and process the induced voltages to produce a digital representation of the rotor position. For example, the AD2S 1200 is a 12-bit R/D converter with reference oscillator available from Analog Devices of Norwood, Mass., which offers a selection of a fixed excitation frequency at either 10 kHz, 12 kHz, 15 kHz, or 20 kHz.

The electric drive system is subjected to significant amounts of electromagnetic noise propagating to and from the motor and/or generator. Since the resolver is mounted very close to the electric machine on the same shaft, it is especially sensitive to electromagnetic noise coupling from the electric machine. This noise can result in incorrect position feedback, potentially causing unstable operation and increased losses. The addition of electromagnetic shielding components is undesirable because of the added weight, cost, and space penalties. A better signal-to-noise ratio can be obtained by generating the resolver excitation signal at a higher voltage amplitude, but this solution also results in increased cost and additional space on the printed circuit board in the control module.

SUMMARY OF THE INVENTION

The present invention schedules (i.e., varies) the resolver excitation frequency in real time as a function of electric machine operating point in order to avoid undesirable electromagnetic noise interactions between the electric machine and resolver. Since the frequency content of the electromagnetic noise varies according to the operating point (e.g., machine speed, PWM frequency, or other parameters), an optimal signal-to-noise ratio can be obtained for the resolver output signals by shifting the excitation signal frequency to be spaced away from the peaks in the noise.

In one aspect of the invention, an electric drive system is provided for an electric vehicle. An electric machine (e.g., motor or generator) is adapted to be coupled to wheels of the vehicle for conversion between stored electrical energy and rotation of the wheels. A resolver is coupled to the electric machine having a rotor rotating with the electric machine, the resolver responding to an excitation signal to produce a position signal. A controller is coupled to the resolver to receive the position signal and coupled to the electric machine to control the conversion. The controller generates the excitation signal at a variable frequency selected as a function of an operating point of the electric machine to avoid harmonic noise peaks propagating at the electric machine.

DETAILED DESCRIPTION OF PREFERRED EMBODIMENTS

Figure 1:
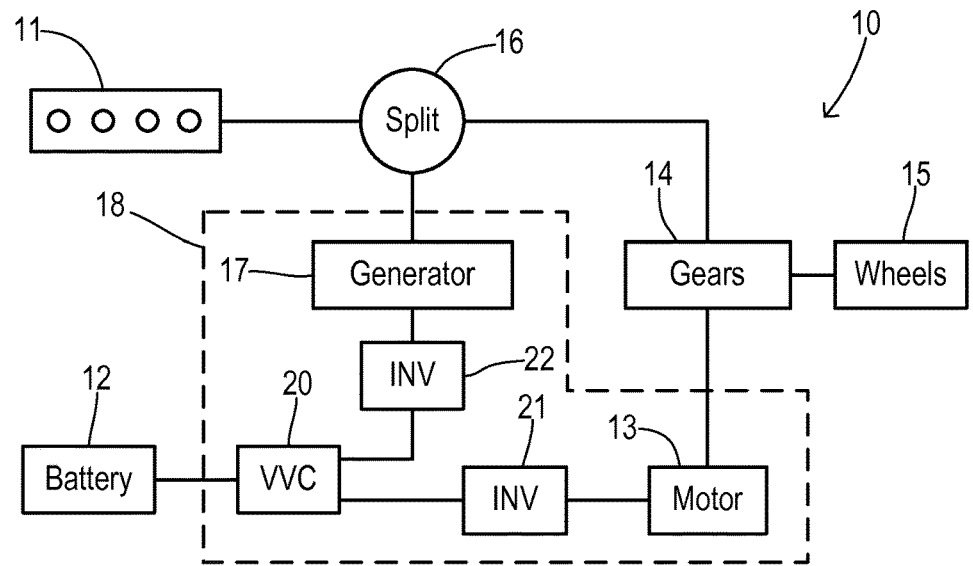
FIG. 1 is a block diagram showing an electric vehicle of one type for incorporating the present invention.

Referring now to FIG. 1, a vehicle 10 is shown as a hybrid electric vehicle with an electric drive system 18. Although a powersplit hybrid layout is shown, the present invention is also applicable to any type of electric vehicle (e.g., HEV, PHEV, or a fully electric vehicle). An internal combustion engine 11 and a battery pack 12 supply energy for propelling vehicle 10. Battery 12 drives a motor 13 with an output coupled to transmission gears 14 for driving vehicle wheels 15. A mechanical output of engine 11 is coupled to gears 14 via a splitting device 16 for providing an engine-driven mode of the powertrain. Splitting device 16 also couples gears 14 to a generator 17 so that during regenerative braking, available mechanical power from wheels 15 can be used to rotate generator 17, with recovered energy being used to charging battery 12 as known in the art. Thus, the electric machines (i.e., motor 13 and generator 17) are each coupled to wheels 15 for bidirectionally converting between stored electrical energy and rotation of the wheels.

Electric drive system 18 includes a variable voltage converter 24 converting the battery voltage to a desired bus voltage which is controllably switched (i.e., commutated) by an inverter 21 to drive motor 13. An inverter 22 is coupled between generator 17 and converter 20 so that AC power from generator 17 during regenerative braking is inverted to DC power, which is further converted by converter 20 to an appropriate voltage for recharging battery 12.

Figure 2:
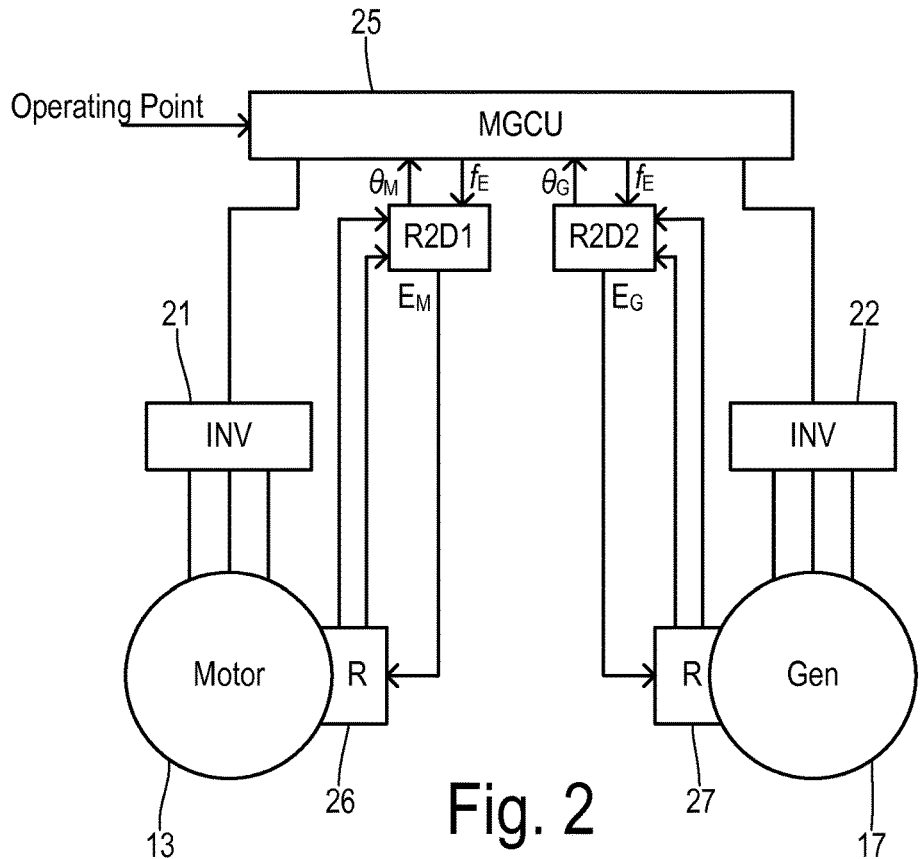
FIG. 2 is a block diagram showing an electric drive according to one preferred embodiment of the invention.

In order to control transistor switches (not shown) in converter 20 and inverters 21 and 22, electric drive system 18 includes a motor-generator control unit (MGCU) shown in FIG. 2. MGCU 25 is coupled to inverters 21 and 22 to selectably drive the switches in respective phase legs of the inverters as known in the art. A resolver 26 is coupled to motor 13, and a resolver 27 is coupled to generator 17. MGCU 25 is connected to a pair of resolver-to-digital chips R2D1 and R2D2. For motor 13, an excitation frequency command $f_E$ is provided from MGCU 25 to the R2D1 chip to control its oscillator to provide an excitation signal $E_M$ to resolver 26. For generator 17, an excitation frequency command $f_E$ is provided from MGCU 25 to the R2D2 chip to control its oscillator to provide an excitation signal $E_G$ to resolver 27.

Resolvers 26 and 27 each respond to the excitation signal by producing a respective pair of induced voltages that uniquely identify the rotor position within each resolver. Each pair of resolver output signals is connected to the R2D chips, respectively, for converting to rotational (angular) position data comprised of an angle $\theta_M$ for motor 13 and $\theta_G$ for generator 17. Angles $\theta_M$ and $\theta_G$ are provided to MGCU 25 which uses them to control the conversion between stored electrical energy and rotation of the vehicle wheels.

Figure 3:
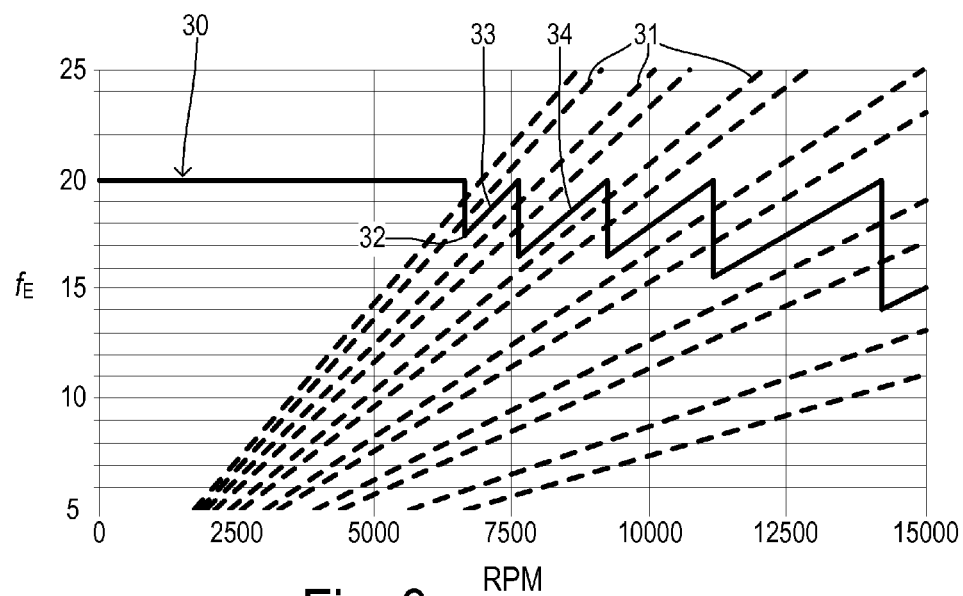
FIG. 3 is a plot showing a variable excitation frequency determined according to a speed of the electric machine.

Based on an operating point at which the motor/generator is currently working, MGCU 25 selects a variable frequency for the excitation signal as a function of the operating point in order to avoid harmonic noise peaks propagating at the electric machine. FIG. 3 shows a plot 30 of the frequency of the excitation signal as compared to electromagnetic noise peaks occurring at harmonic frequencies generated by electric machine rotation as the speed of rotation changes. Dashed lines 31 each shows a changing frequency of a respective harmonic noise peak occurring in the noise spectra. More specifically, each respective peak exhibits a linear increase with increasing speed. The selected frequency for the excitation signal is plotted to be spaced away from the noise peaks (e.g., the peaks occurring at the fundamental rotation frequency and each of the significant harmonics). Thus, excitation frequency plot 30 initially follows a constant frequency value of 20 kHz at the lowest rotation speeds of the electric machine. As a noise peak in the electromagnetic noise approaches the excitation frequency signal value with increasing speed, the excitation frequency drops to a new value at a point 32 so that the resulting excitation frequency remains spaced from the harmonic noise peaks. For example, the new value 32 is selected to be located halfway between a pair of harmonic noise peaks and then follows a linear increase to maintain the same spacing from the harmonic noise peaks along a line segment 33. For practical reasons, the excitation frequency is typically maintained between certain upper and lower limits. As shown in FIG. 3, when the excitation frequency value along segment 33 reaches 20 kHz, the value again drops to a lower excitation frequency between a next successive pair of harmonic noise peaks and then continues to follow a linear increase along a segment 34 as machine speed further increases. The foregoing pattern repeats for the additional increases in machine speed that occur.

Figure 4:
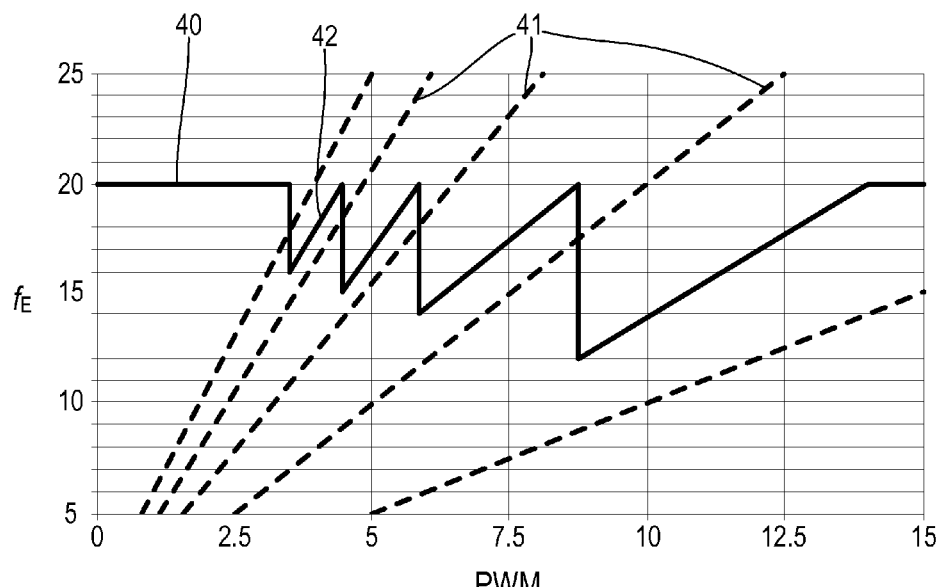
FIG. 4 is a plot showing a variable excitation frequency determined according to a frequency of a PWM signal provided to the electric machine.

FIG. 4 shows an alternative embodiment wherein an excitation frequency is selected according to a pulse-width modulated (PWM) frequency being used by the controller for switching the inverter switches in order to control the electrical-to-mechanical energy conversion. In this embodiment, the operating point is being defined according to the PWM frequency, which in turn is used to determine the excitation frequency. A plot 40 shows a function for selecting the frequency for the excitation signal. Plot 40 yields a value of 20 kHz at PWM frequencies below about 3 kHz, for example. Dashed lines 41 represent the PWM harmonic signals which each increases linearly in frequency as the fundamental PWM frequency increases. To maintain plot 40 in a desired spaced relationship from dashed lines 41, sloping segments such as a segment 42 are utilized between successive PWM harmonic frequency peaks in a similar manner to FIG. 3.

Figure 5:
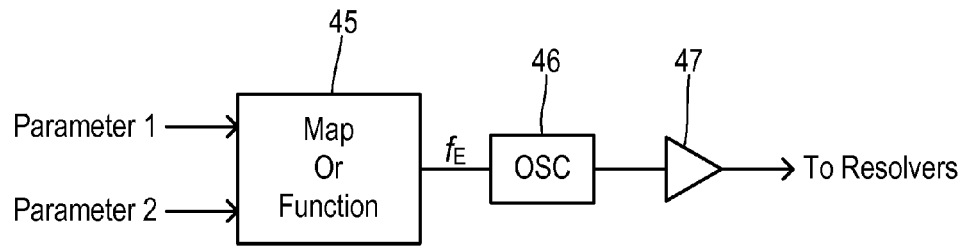
FIG. 5 is a block diagram showing control elements for determining an excitation frequency in response to measured electric machine parameters using a map or lookup function.

As shown by FIGS. 3 and 4, the present invention can employ a one-dimensional operating point wherein a single parameter such as machine RPM or PWM frequency directly determines an excitation frequency value. Alternatively, multiple parameters can be used to define the operating point, wherein the excitation signal frequency is selected in response to a multi-dimensional relationship. For example, as shown in FIG. 5 a map (i.e., lookup table) or graphically or mathematically-defined function 45 responds to a plurality of parameters such as Parameter 1 and Parameter 2 in order to yield a corresponding value for the excitation frequency $f_E$ which commands an oscillator 46 to produce a corresponding AC signal at commanded frequency $f_E$. An amplifier 47 may be used as a buffer to couple the excitation signal to the resolvers.

Figure 6:
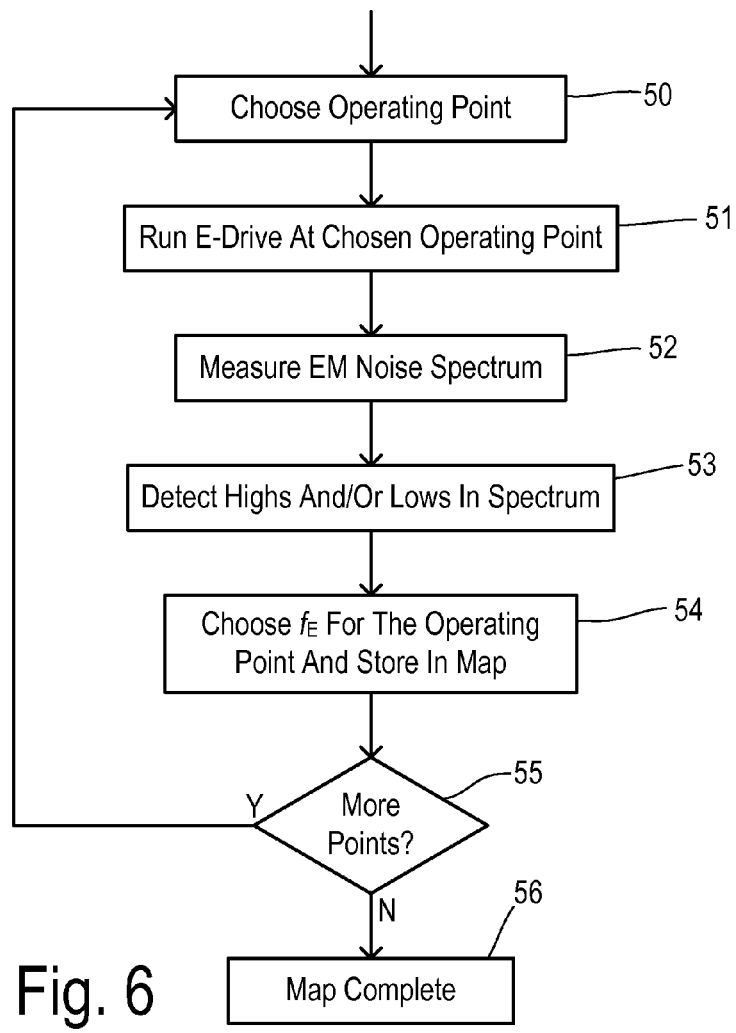
FIG. 6 is a flowchart showing one embodiment of a method for obtaining a map relating operating points of the electric machine to corresponding excitation frequencies.

One skilled in the art will recognize various procedures that can be used to define appropriate functional or mapping relationships between the operating point and the excitation signal frequency. Such procedures can be based on empirical measurements or computer simulations, for example. FIG. 6 shows one embodiment of a method for developing a mapping table to be used in a motor/generator control unit in order to relate various operating points to corresponding excitation frequencies. During development of an electric drive system, a prototype unit may be operated to quantify the actual electromagnetic noise existing for different operating points. In step 50, each operating point is systematically chosen in a manner that eventually covers all the operating points of interest. For each parameter included in the operating point, the full range of interest may be divided into blocks. Each individual operating point corresponds to a respective combination of the blocks for all the constituent parameters.

Using a chosen operating point, the electric drive system is run in step 52 while the electromagnetic spectrum is measured in step 52. In step 53, highs and/or lows in the spectrum are detected. In step 54, the spectrum is examined and an excitation frequency is chosen for the corresponding operated point and then stored in a map. The peaks can be detected in order to place excitation frequency values away from the identified peaks (e.g., midway between adjacent peaks). Alternatively, the lows in each spectrum can be detected and the excitation frequencies placed at the lows, which inherently spaces the excitation signal frequencies away from the peaks. Upper and lower bounding frequencies (e.g., 20 kHz and 4 kHz, respectively) may be determined in advance to ensure that the excitation frequency remains within the specifications for the resolver transformer. If a continuously variable oscillator frequency is available, then the chosen frequency can assume any value that optimizes the signal-to-noise. In the event that an R2D chip is used having only a set of available excitation frequencies then the one is chosen corresponding to the lowest noise spectrum.

A check is performed in step 55 to determine whether additional operating points are remaining. If so, then a return is made to step 50 for processing the next operating point. Once there are no more operating points remaining, the map is completed in step 56 and is ready for use in production vehicles containing the electric drive system.

In operation, an electric drive system senses rotational position of an electric machine by measuring an operating point of the machine. Then an excitation signal is generated at a selected frequency spaced from noise peaks associated with the operating point (e.g., by looking up the frequency in a map or evaluating a corresponding function). The excitation signal is coupled to an input of a resolver that rotates with the machine. A rotational position of the machine is determined in response to an output induced in the resolver by the excitation signal, such that the signal-to-noise ratio of the induced output is optimized because the influence of harmonic noise peaks of the electromagnetic noise is minimized.

What is claimed is:

1. An electric drive system for an electric vehicle, comprising:
   an electric machine adapted to be coupled to wheels of the vehicle for conversion between stored electrical energy and rotation of the wheels;
   a resolver coupled to the electric machine having a rotor rotating with the electric machine, the resolver responding to an excitation signal to produce a position signal; and
   a controller coupled to the resolver to receive the position signal and coupled to the electric machine to control the conversion, wherein the controller generates the excitation signal at a variable frequency selected as a function of an operating point of the electric machine to avoid harmonic noise peaks propagating at the electric machine.

2. The system of claim 1 wherein the operating point is determined in response to a rotation speed of the electric machine.

3. The system of claim 1 wherein the operating point is determined in response to a PWM frequency being used by the controller to control the conversion.

4. The system of claim 1 wherein the operating point is determined in response to a voltage used for the conversion.

5. The system of claim 1 wherein the frequency of the excitation signal is selected to be spaced from a rotation frequency of the electric machine and spaced from harmonics of the rotation frequency.

6. The system of claim 1 wherein the frequency of the excitation signal is selected to be spaced from a PWM frequency being used by the controller to control the conversion and spaced from harmonics of the PWM frequency.

7. The system of claim 1 wherein the controller includes a map relating a plurality of operating points to corresponding frequencies for the excitation signal.

8. The system of claim 1 wherein the electric machine is comprised of a motor.

9. The system of claim 1 wherein the electric machine is comprised of a generator.

10. A method of sensing rotational position of a machine in an electric drive system, comprising:
    measuring an operating point of the machine;
    generating an excitation signal at a selected frequency spaced from noise peaks associated with the operating point;
    coupling the excitation signal to an input of a resolver rotating with the machine; and
    determining a rotational position of the machine in response to an output induced in the resolver by the excitation signal.

11. The method of claim 10 wherein the machine is an electric motor for a electric vehicle drive system.

12. The method of claim 10 wherein the machine is an electric generator for recharging a battery in an electric vehicle by regenerative braking.

13. The method of claim 10 wherein the operating point is determined in response to a rotation speed of the machine.

14. The method of claim 10 wherein the machine is coupled to wheels of an electric vehicle for conversion between stored electrical energy and rotation of the wheels, and wherein the operating point is determined in response to a PWM frequency being used to control the conversion.

15. The method of claim 10 wherein the machine is coupled to wheels of an electric vehicle for conversion between stored electrical energy and rotation of the wheels, and wherein the operating point is determined in response to a voltage used for the conversion.

16. The method of claim 10 wherein the frequency of the excitation signal is selected to be spaced from a rotation frequency of the machine and spaced from harmonics of the rotation frequency.

17. The method of claim 10 wherein the machine is coupled to wheels of an electric vehicle for conversion between stored electrical energy and rotation of the wheels, and wherein the frequency of the excitation signal is selected to be spaced from a PWM frequency being used to control the conversion and spaced from harmonics of the PWM frequency.

18. The method of claim 10 wherein the selected frequency is identified using a map relating a plurality of operating points to corresponding frequencies for the excitation signal.

19. A motor position sensing system for a motor with an operating point controlled by pulse-width modulation (PWM), comprising:
    a resolver having a rotor to rotate with a motor, and having a primary and two secondary stator windings;
    an oscillator providing an excitation signal to the primary winding, wherein the resolver responds to the excitation signal to produce a position signal; and
    a controller receiving the position signal and detecting the operating point of the motor in real time and shifting a frequency of the excitation signal as a function of the operating point to avoid harmonic noise peaks propagating at the motor.

* * * * *